United States Patent [19]

Bacon et al.

[11] Patent Number: 5,622,305

[45] Date of Patent: Apr. 22, 1997

[54] BONDING SCHEME USING GROUP VB METALLIC LAYER

[75] Inventors: Donald D. Bacon, Somerset; Cheng-Hsuan Chen, New Providence; Ho S. Chen, Lebanon; Avishay Katz, Westfield; King L. Tai, Berkeley Heights, all of N.J.

[73] Assignee: Lucent Technologies Inc., Murray Hill, N.J.

[21] Appl. No.: 438,296

[22] Filed: May 10, 1995

[51] Int. Cl.⁶ .............................. B23K 31/02; B23K 1/20
[52] U.S. Cl. ....................... 228/123.1; 228/208; 228/121; 428/662
[58] Field of Search ................. 228/123.1, 208, 228/121; 428/662, 672

[56] References Cited

U.S. PATENT DOCUMENTS

| | | | |
|---|---|---|---|
| 2,555,001 | 5/1951 | Ohl | 175/366 |
| 3,325,702 | 6/1967 | Cunningham | 317/234 |
| 3,492,719 | 2/1970 | Zeitman et al. | 228/123.1 |
| 3,518,066 | 6/1970 | Bronnes et al. | 428/662 |
| 4,772,935 | 9/1988 | Lawler et al. | 357/71 |
| 4,946,376 | 8/1990 | Sharma et al. | 428/620 |
| 4,995,546 | 2/1991 | Regnavit | 228/208 |
| 5,234,153 | 8/1993 | Bacon et al. | 228/122.1 |

OTHER PUBLICATIONS

J.J. Cuomo and J.P. Gilvey, "Method of Bonding to Diamond Surface," *IBM Tech. Discl. Bull.*, vol. 12, No. 4, Sep. 1960, p. 570.

H.S. Chen et al., "Simple Nb Bonding Structure," *Appl. Phys. Lett*, 66(17), Apr. 24, 1996, pp. 2191–2193.

*Primary Examiner*—P. Austin Bradley
*Assistant Examiner*—Jeffrey T. Knapp

[57] ABSTRACT

A method for bonding one body to another, such as a laser device to a submount, uses a metallic layer composed of a Group VB metal, such as niobium, sandwiched between a non-metallic layer and solder layer formed by an approximate Au-Sn eutectic layer. Advantageously the Group VB layer is formed at a submount temperature of less than approximately 201° C., advantageously less than approximately 125° C., and preferably less than approximately 101° C.—advantageously to a thickness in the approximate range 0.05 µm to 0.2 µm, or even thinner if pinholes do not develop. The non-metallic layer is located on one of the bodies, and the other body has a metallic coating advantageously capped with an Au layer.

21 Claims, 1 Drawing Sheet

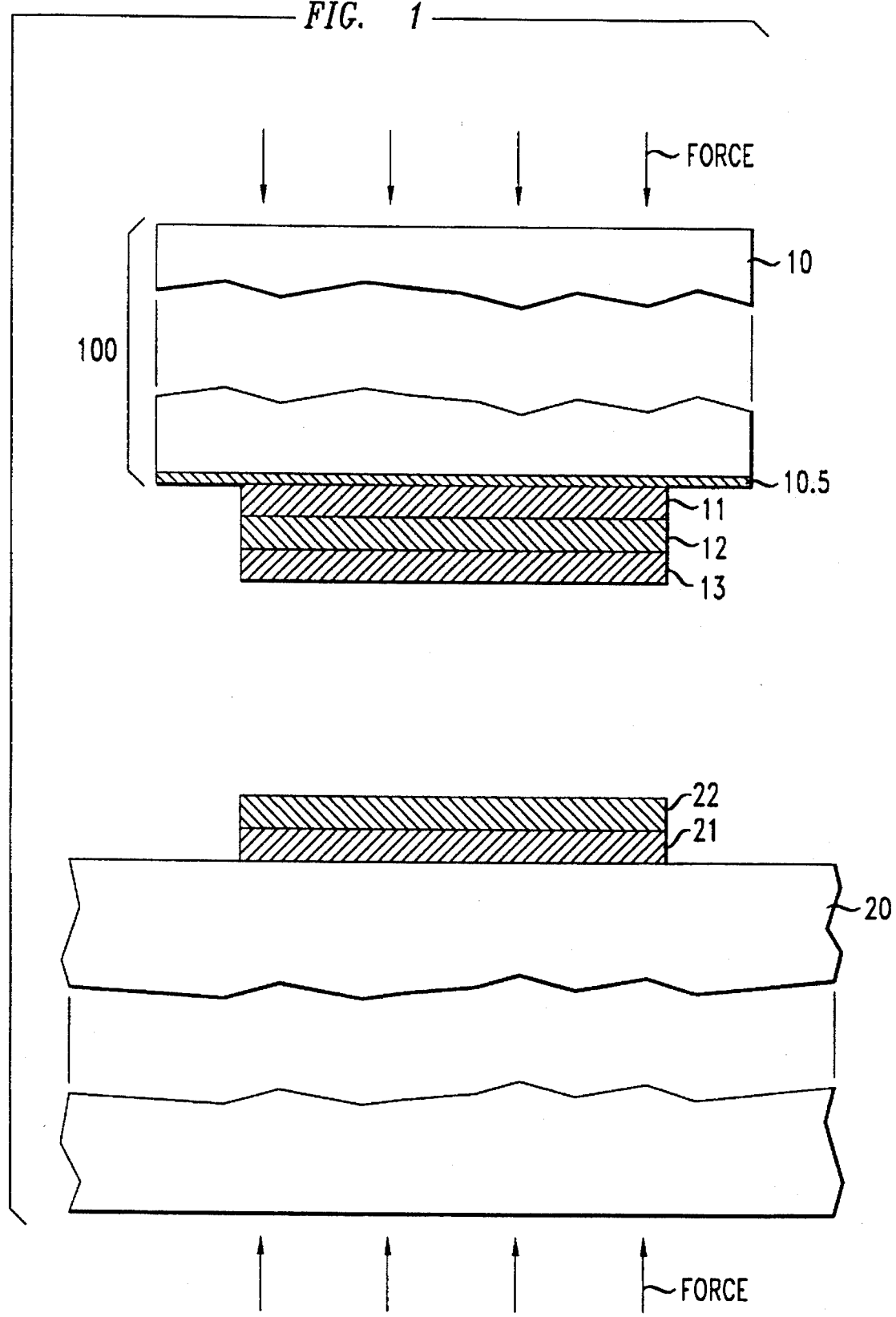

BONDING SCHEME USING GROUP VB METALLIC LAYER

TECHNICAL FIELD

This invention relates to bonding methods, and more particularly to metallic bonding methods that are suitable for bonding those devices that generate heat during subsequent operation, such as semiconductor laser devices and semiconductor integrated circuit devices, to heat dissipation devices, such as submounts and headers, respectively.

BACKGROUND OF THE INVENTION

During operation of a semiconductor laser device, i.e., when it is generating optical radiation, it also generates relatively large amounts of heat that must be quickly and efficiently conducted away from the device, lest its temperature rise to an undesirable level and its useful device lifetime be undesirably reduced.

U.S. Pat. No. 4,772,935 teaches a process for thermal-compression bonding of a silicon integrated circuit device to a package comprising a header. The process utilizes sequential formation on a major surface of a silicon wafer (substrate), prior to its being cut into a plurality of dies, the following successive layers: (1) an adhesion layer of titanium: (2) a barrier layer, preferably of tungsten; (3) a bonding layer, preferably of gold. Also a stress-relieving layer, preferably of gold, can be formed earlier between the adhesion layer of tungsten and the major surface of the wafer. Thereafter, the substrate is cut into the plurality of dies, each of which is bonded, for example, to a ceramic header ("submount"). Prior to the die's being bonded to the header, a major surface of the header is coated with a layer of gold that, in turn, is coated with a binding layer of solder, preferably a gold-tin eutectic. The purpose of the adhesion layer is to promote adhesion of the tungsten barrier layer to the substrate. The purpose of the barrier layer is to suppress, among other things, migration of silicon from the substrate into the originally eutectic binding layer of solder, such migration causing an undesirable increase in the melting temperature of the binding layer of solder and hence a required undesirably high temperature rise in the wafer during the thermal-compression bonding process in which the binding layer of solder must be melted to wet the surface to be bonded. The purpose of the bonding layer of gold is to protect the barrier layer from oxidation that would weaken the resulting bond.

In the aforementioned patent, the thickness of the binding layer of solder was reported to be 0.5 to 1.0 mil (12.7 to 25.4 µm). Such a relatively large thickness, regardless of relatively small thicknesses of other layers, is not desirable in the context of bonding, for example, relatively high power (over 100 milliwatt) semiconductor laser devices to a submount, because of the need of a significantly higher thermal conductance and hence significantly smaller thickness of the entire resulting bond between semiconductor laser device and the submount such as a silicon body coated with silicon dioxide or a CVD (chemically vapor deposited) diamond body.

On the other hand, when a gold-tin solder layer is made desirably thin from the standpoint of good and sufficient thermal conductance—i.e., about 4 µm or less—then surface regions of the solder suffer from premature freezing (solidification) during the bonding process when heat is applied in quantities sufficient to raise the temperature of the solder above its melting temperature, namely about 280° C. in cases where the gold-tin solder has a eutectic composition (i.e., gold: 80 per centum by weight: tin: 20 per centum by weight) and hence a desirable minimum melting temperature. This premature freezing is caused by migration of tin away from the surface of the solder (initially having a eutectic or even a tin-rich nearly eutectic composition), whereby (because the solder's surface regions no longer have the eutectic or nearly eutectic compositions) the melting (=freezing) point of the solder's surface regions dramatically increases. This increase in temperature can be as much as about 30° C. per centum (by weight) decrease of the tin component located in the neighborhood of the eutectic composition on its tin-poor side. Consequently, surface regions of the solder undesirably solidify ("freeze") during bonding, because the bonding process cannot be performed at a temperature that is high enough to prevent this freezing and at the same time is low enough so as not to injure the device. This premature freezing of the solder causes poor "wetting" of the surface of the gold bonding layer (on the barrier layer) on the device by the solder and consequently poor bonding of the device to the submount. Thus, during subsequent device operation, the resulting poor thermal conductance of the resulting bond (caused by the poor "wetting") tends to cause injurious overheating of the device, and the resulting poor mechanical adhesion property of the bond tends to allow the device to detach from the submount.

On the other hand, gold-tin solder is preferred over other solders—such as indium, lead-tin, tin-lead, tin-indium, or lead-indium-silver—because of its relatively high Young's modulus of elasticity and hence its resulting mechanically more stable (rigid) bond. Also bonds made from gold-tin solder tend to have desirably lower creep, such lower creep being associated with the relatively high melting temperature (280° C. or more) of a gold-tin solder. Moreover, gold-indium solder has too high a melting temperature (about 457° C.) for bonding lasers, because such a high temperature tends to injure the laser during bonding.

Therefore, it would be desirable to have a bonding method using a gold-tin solder, but which mitigates the shortcomings of prior art.

SUMMARY OF THE INVENTION

We have discovered a relatively simple way of mitigating the problem of premature freezing of gold-tin (Au-Sn) solders while retaining the advantages of using a Au-Sn solder. More specifically, we have found a relatively simple metallic bonding method of bonding one device to another, the method involving the use of a metallic niobium (or other Group VB) layer that is composed of substantially pure Nb (or other Group VB metal or a mixture of Group VB metals). This metallic niobium (Nb) layer advantageously is located between the surface of a body, typically a heat-dissipating submount) and a Au-Sn solder layer. The submount is to be bonded to another body, typically a heat-generating device such as a laser device or a semiconductor integrated circuit device. Advantageously, the submount is a CVD diamond body or a silicon body coated with an electrically insulating layer such as a layer of silicon dioxide, alumina. aluminum nitride, silicon nitride, tantalum nitride, or silicon oxynitride.

The Au-Sn solder layer advantageously is essentially a precise (or a nearly precise) Au-Sn eutectic mixture (or alloy) or an approximate Au-Sn eutectic mixture (alloy). A nearly precise Au-Sn eutectic mixture has the atomic formula of approximately $Au_{71}Sn_{29}$. Thus, the solder layer can have an Au composition of Au and Sn in which the ratio of Sn to Au by weight falls in the approximate range of 18-to-21 wt-percent (that is: an approximate range of 18-to 21 wt-percent Sn mixed with approximately 82-to-79 wt-percent Au). This ratio of Sn to Au is equal to approximately 20 wt-percent Sn in a precise (or in a nearly precise) eutectic.

An alloy layer of Nb and Sn (such as $NbSn_2$), or of nickel and tin (such as $Ni_3Sn_4$), or of pure tin (Sn), or of pure gold(Au) optionally can intervene between the pure Nb (or other Group VB) layer and the Au-Sn solder layer.

During the formation of the Nb (or other Group VB) layer the structure (including the submount) is heated to a temperature T that is is preferably within the approximate range of 61° C. to 101° C., advantageously not higher than approximately 125° C., and typically is not lower than room temperature and should not be higher than approximately 201° C. In this way, unwanted interdiffusion of the material on which the layer of Nb (or other Group VB layer) is avoided: such interdiffusion would cause the Nb layer to be brittle.

It is also important that, after the formation of the layer of Nb (or other (Group VB layer), including after bonding the bodies together, the structure should not be heated to a temperature higher than approximately 350° C., advantageously not higher than approximately 320° C., in order not to harm the devices during the heating, especially such devices as the laser device or the semiconductor integrated circuit device.

In a specific embodiment, a metallic bonding method includes the steps of:

forming, contiguous with least a portion of a major surface of a body, a Group VB metallic layer such as a metallic niobium layer; and forming, overlying the Group VB metallic layer, a solder layer.

It is advantageous in this embodiment that the method further includes the steps of pressing the solder layer against a metallic coating located on at least a portion of a major surface of a device, and heating the solder layer above its melting temperature. It is further advantageous in this embodiment that the portion (on which the Group V metallic layer is formed) of the major surface of the body is nonmetallic. It is further advantageous that the Group VB metallic layer is formed in direct physical contact with this portion of the surface of the body. It is further advantageous that the Group VB layer is niobium and that it has a thickness in the approximate range of 0.05 μm to 0.2 μm, or even thinner than approximately 0.05 μm if pinholes do not develop—values in the lower region of the range to be chosen for high thermal conductance. It is yet further advantageous that solder layer is essentially a Au-Sn solder. It is yet still further advantageous that the solder layer is essentially either an approximate or a precise (or a nearly precise) Au-Sn eutectic, and that this layer is deposited with a thickness in the approximate range 1 μm to 3 μm.

In order to bond a device (such as a laser device or an integrated circuit device) to the body, it is yet further advantageous that the method further include the steps of pressing the solder layer against a metallic coating, located on at least a portion of the surface of the device, and heating the solder layer above its melting temperature. The metallic coating advantageously is capped with a wetting layer prior to the pressing step. This wetting layer is typically a standard Ti-Pt-Au layer, and it can advantageously be a Group VB layer such as Nb-Au.

The correctness of our theory of the invention is not, of course, essential to the success of the invention. Our theory is that the Nb (or other Group VB) layer serves at least three purposes, First, the Nb layer provides a barrier layer: such a barrier layer prevents undesirable contacting by the Au-Sn solder of the underlying material of the submount (such as CVD diamond). Second, the Nb layer provides a wetting layer that the Au-Sn solder wets very readily during bonding process; therefore, a good strong bond can be formed. Third, the Nb layer forms a strong bond directly with the surface of the underlying device: this surface can be, for example, as mentioned above, CVD diamond, silicon dioxide, alumina. aluminum nitride, silicon nitride, tantalum nitride, or silicon oxynitride,. In this way, with a relatively simple metallic bonding scheme, the bonding time duration can be as small as approximately 6-to-8 seconds, while the bonding temperature (i.e., the elevated temperature of the solder during the bonding process) is in the approximate range of 300° C. to 320° C.—the melting point of a precise Au-Sn eutectic being approximately 280° C. Accordingly, the device is not injured during the bonding at the elevated temperatures (or during subsequent electrical operations when heat is generated by the device). At the same time, premature freezing of the Au-Sn solder is avoided during the bonding.

BRIEF DESCRIPTION OF THE DRAWING

FIG. 1 is a cross-sectional elevation view of a metallic structure being bonded according to a specific embodiment of the invention.

Only for the sake of clarity, the drawing is not to any scale.

DETAILED DESCRIPTION

A semiconductor laser device 100 (FIG. 1) typically includes a Group III–V semiconductor laser structure such as a GaAs-based or an InP-based laser chip 10, as known in the art. It is to be bonded to a submount 20. This submount 20 comprises, for example, a CVD (chemically vapor deposited) diamond body. Alternatively, the submount 20 comprises a silicon body that has been coated with an electrically insulating layer such as a silicon dioxide layer, an alumina layer, an aluminum nitride layer, a silicon nitride layer, a tantalum nitride, or a silicon oxynitride layer (none shown). The laser chip 10 has a contact electrode layer 10.5 that both physically and electrically contacts a bottom surface of the chip 10. Typically the contact electrode layer 10.5 comprises Au alloyed with germanium or beryllium. A metallization pad, located on the contact electrode layer 10.5, illustratively comprises a titanium layer 11, a platinum layer 12, and a gold layer 13. The cross section of this pad typically has the approximate dimensions of 40 μm by 40 μm. In any event, it is preferred that the final layer of the pad comprises gold; that is, it is preferred that the metallization be capped with the gold layer 13.

Instead of a laser device 10, a semiconductor integrated circuit chip (not shown), advantageously having metallization pads that are capped with gold, can be the device to be bonded to the submount 20.

On at least a portion of the top surface of the submount 20 are located a niobium (Nb) layer 21 and a Au-Sn solder layer 22 on the niobium layer 21. The Nb layer 21 advantageously has a thickness as small as approximately 0.05 μm, for the purpose of the Nb layer's having good thermal conductance. However, this thickness can be as much as typically approximately 0.2 μm, and can be even less than approximately 0.05 μm if pinholes do not develop.

The Au-Sn solder layer 22 advantageously has an approximate eutectic composition. That is to say, the layer 22 advantageously has a composition in the approximate range of 19-to-22 wt-percent Sn (81-to-78 wt-percent Au). Preferably this layer 22 is a nearly precise Au-Sn eutectic (i.e., has the composition of approximately 20 wt-percent Sn, corresponding to the approximate atomic formula $Au_{71}Sn_{29}$).

An intermediate metallic layer (not shown) optionally can intervene between the Nb layer 21 and the gold-tin layer 22. This intermediate metallic layer advantageously can be an alloy layer of Nb and Sn (such as $NbSn_2$), or of nickel and tin (such as $Ni_3Sn_4$), or of pure tin (Sn), or of pure gold (Au), and it has a thickness typically in the approximate range of 0.01 μm to 0.1 μm.

In order to fabricate the metallization on the surface of the submount 20, the submount 20 is placed in a DC magnetron sputtering chamber (not shown) having three metallic sputtering targets and an ion-beam gun. This chamber enables in-situ depositions of metal layers without exposure to ambient air. Prior to deposition of the Nb layer 21, the surface of the submount 20 is cleaned by means of ion-beam sputtering, whereby contaminants are removed. The Nb layer 21 is then deposited onto the thus cleaned top surface of the submount 20 at a temperature T that is typically less than approximately 201° C., advantageously less than approximately 125° C., and preferably less than approximately 101° C.—to a thickness in the approximate range of typically 0.05 μm to 0.2 μm. However this thickness can be less that approximately 0.05 μm if pinholes do not develop, and the temperature T can be as low as room temperature. On the other hand, larger thicknesses are disadvantageous from the standpoint of poor heat conductance. The (optional) intermediate metallic layer (not shown) can then be deposited, typically to a thickness of approximately 0.1 μm.

Next the solder layer 22 is deposited, as by a known method, to a thickness in the approximate range of 1.0 μm to 3.0 μm.

Finally, in order to bond the laser device 100 to the submount 20, they are both placed in a heating chamber (not shown). The exposed surfaces of the gold layer 13 and the solder layer 22 are pressed together by means of compressive forces F at an elevated temperature T' for a relative short time duration Δt. Typically this elevated temperature T' is in the approximate range of 280° C. to 340° C., and advantageously is approximately 290° C. to 320° C., and this time duration Δt is typically in the approximate range of 6 sec to 1 min.

Although the invention has been described in detail in terms of specific embodiments, various modifications can be made without departing from the scope of the invention. For example, instead of depositing the Nb layer 21 by means of sputtering, other deposition techniques can be used such as evaporation from a Nb target bombarded with an electron beam. Moreover, instead of Nb, other Group VB metals can be used such as vanadium (V), tantalum (Ta), or mixtures (alloys) of any of these Group VB metals. Instead of being capped with Ti-Pt-Au, the metallization pad of the laser or other device 100 can be capped with a Group VB layer, such as niobium, in turn capped with gold. And instead of titanium, platinum and gold, respectively, the layers 11, 12, and 13 can comprise chromium, copper, and gold, respectively.

What is claimed:

1. A method for bonding a device to a support substrate comprising the steps of:

a. coating said device with one or more bonding layers,
   b. coating said support substrate with a barrier layer,
   c. coating said barrier layer with a bonding layer comprising a solder layer,
   d. placing said device and said support substrate together with the said bonding layers in mutual contact, and
   e. heating said bonding layers to bond the device to said support substrate the invention characterized in that:
      1. at least part of said support substrate comprises a non-metallic material,
      2. the said barrier layer is formed directly on said support substrate,
      3. the said barrier layer comprises a group VB metal layer, and
      4. the solder layer is deposited in situ on the said barrier layer directly after deposition of the said barrier layer.

2. The method of claim 1 in which the Group VB metallic layer is essentially niobum.

3. The method of claim 1 in which the Group VB metallic layer has a thickness in the approximate range of 0.05 μm to 0.2 μm.

4. The method of claim 1 further including, between steps (b) and (c), the step of forming an intermediate metallic layer on the Group VB metallic layer.

5. The method of claim 1 further including the steps of pressing the solder layer against a metallic coating located on at least a portion of the major surface of the device, and heating the solder layer above its melting temperature.

6. The method of claim 1 further including the steps of pressing the solder layer against a metallic coating located on at least a portion of a major surface of the device, and heating the solder layer above its melting temperature, and in which the solder layer comprises a gold-tin solder.

7. The method of claim 6 in which the solder layer has a thickness in the approximate range of 1.0 μm to 3.0 μm.

8. The method of claim 6 in which the solder layer has a tin content that is in the approximate range of 19 percent to 22 percent by weight.

9. The method of claim 6 in which the solder layer has a tin content that is approximately equal to 20 percent by weight.

10. The method of claim 9 in which the solder layer has a thickness in the approximate range of 1.0 μm to 3.0 μm.

11. The method of claim 1 in which the Group VB metallic layer comprises niobium.

12. The method of claim 11 further including the steps of pressing the solder layer against a metallic coating located on at least a portion of a major surface of the device, and heating the solder layer above its melting temperature.

13. The method of claim 11 further including the steps of pressing the solder layer against a metallic coating located on at least a portion of a major surface of a device, and heating the solder layer above its melting temperature, and in which the solder layer comprises a gold-tin solder layer.

14. The method of claim 13 in which the temperature in step (a) is less than approximately 125° C.

15. The method of claim 14 in which the temperature in step (a) is less than approximately 101° C.

16. A method for bonding a device to a support substrate comprising the steps of:

a. coating said device with one or more device bonding layers,
   b. coating said support substrate with a barrier layer,
   c. coating said barrier layer with a support substrate bonding layer comprising a gold-tin solder layer, d. pressing said support substrate bonding layer against said device bonding layer, and e. heating said support substrate bonding layer to a temperature in the range 61° C. to 101° C., the invention characterized in that:
1. at least part of said support substrate comprises a non-metallic material,
2. the said barrier layer is formed directly on said support substrate,
3. the said barrier layer comprises niobium, and
4. the said support substrate bonding layer is deposited in situ directly on the said barrier layer.

17. A method for bonding a device to a support substrate comprising the steps of:
a. coating said device with one or more bonding layers,
b. coating said support substrate with a barrier layer,
c. forming an intermediate layer on said barrier layer, said intermediate layer comprising gold, tin, or an alloy of tin with niobium or nickel,
d. coating said barrier layer with a bonding layer comprising a solder layer,
e. placing said device and said support substrate together with the said bonding layers in mutual contact, and
f. heating the said bonding layers to bond the device to said support substrate the invention characterized in that:
1. at least part of said support substrate comprises a non-metallic material,
2. the said barrier layer is formed directly on said support substrate,
3. the said barrier layer comprises niobium, and
4. the solder layer is deposited in situ directly on the said barrier layer.

18. The method of claim 17 further comprising the steps of pressing the solder layer against a metallic coating located on at least a portion of a major surface of the device, and heating the solder layer above its melting temperature.

19. The method of claim 18 in which the solder layer comprises a gold-tin solder.

20. The method of claim 19 in which the gold-tin solder layer has a thickness in the approximate range of 1.0 μm to 3.0 μm.

21. The method of claim 19 in which the gold-tin solder layer has a tin content that is in the approximate range of 19 percent to 22 percent by weight.

* * * * *